United States Patent [19]
Lawrence

[11] Patent Number: 5,956,280
[45] Date of Patent: Sep. 21, 1999

[54] CONTACT TEST METHOD AND SYSTEM FOR MEMORY TESTERS

[75] Inventor: Allen B. Lawrence, Austin, Tex.

[73] Assignee: Tanisys Technology, Inc., Austin, Tex.

[21] Appl. No.: 09/032,958

[22] Filed: Mar. 2, 1998

[51] Int. Cl.$^6$ .............................. G11C 7/00; G11C 29/00
[52] U.S. Cl. ...................... 365/201; 324/73.1; 371/21.1
[58] Field of Search ............................... 365/201, 230.03; 324/73.1, 158.1; 371/21.1

[56] References Cited

U.S. PATENT DOCUMENTS

| | | |
|---|---|---|
| 3,712,537 | 1/1973 | Huettner et al. . |
| 4,175,253 | 11/1979 | Pitegoff . |
| 4,348,636 | 9/1982 | Doundoulakis . |
| 4,412,327 | 10/1983 | Fox . |
| 4,488,299 | 12/1984 | Fellhauer et al. ...................... 324/73.1 |
| 4,553,225 | 11/1985 | Ohe . |
| 4,764,925 | 8/1988 | Grimes . |
| 4,862,067 | 8/1989 | Brune et al. ........................... 324/73.1 |
| 4,862,459 | 8/1989 | Fukushima . |
| 4,894,605 | 1/1990 | Ringleb . |
| 4,965,799 | 10/1990 | Green . |
| 4,970,454 | 11/1990 | Stambaugh . |
| 5,053,698 | 10/1991 | Veda . |
| 5,157,629 | 10/1992 | Sato . |
| 5,265,099 | 11/1993 | Feinstein ................................ 371/21.1 |
| 5,280,237 | 1/1994 | Buks . |
| 5,289,117 | 2/1994 | Van Loan . |
| 5,378,981 | 1/1995 | Higgins, III . |
| 5,383,193 | 1/1995 | Pathaic . |
| 5,408,190 | 4/1995 | Wood . |
| 5,414,351 | 5/1995 | Hsu . |
| 5,422,892 | 6/1995 | Hii et al. ................................ 371/21.2 |
| 5,440,231 | 8/1995 | Sugai . |
| 5,444,387 | 8/1995 | Van Loan et al. . |
| 5,477,161 | 12/1995 | Beaman et al. . |
| 5,481,551 | 1/1996 | Nakamo et al. . |
| 5,486,753 | 1/1996 | Khazam et al. . |
| 5,577,050 | 11/1996 | Bair et al. .............................. 365/201 |
| 5,592,496 | 1/1997 | Shimizu et al. . |
| 5,617,038 | 4/1997 | Houston . |
| 5,629,944 | 5/1997 | Kagami . |
| 5,640,102 | 6/1997 | Sato . |
| 5,652,524 | 7/1997 | Jennion et al. . |
| 5,687,178 | 11/1997 | Herr et al. . |
| 5,691,650 | 11/1997 | Sugai . |
| 5,706,234 | 1/1998 | Pilch, Jr. et al. ....................... 365/201 |
| 5,787,097 | 7/1998 | Roohparvar et al. ................... 365/201 |

Primary Examiner—Trong Phan
Attorney, Agent, or Firm—Baker & Botts, L.L.P.

[57] ABSTRACT

A method and system for memory testers which detects the absence of contact between memory tester pins and memory module pins, and which identifies memory module pins which are shorted to a power supply terminal or to ground, pins which are shorted to other pins, and pins which are open.

20 Claims, 8 Drawing Sheets

CONTACT TEST METHOD AND SYSTEM FOR MEMORY TESTERS

RELATED APPLICATIONS

This Application is related to four U.S. patent applications entitled "Tester Systems" U.S. patent Application Ser. No. 09/033,364, "Parametric Test System And Method" U.S. patent application Ser. No. 09/032,968, "Microsequencer for Memory Test System", U.S. patent application Ser. No. 09/033,363, and "Programmable Pulse Generator", assigned to the assignee of the present invention, and filed on even date herewith.

FILED OF THE INVENTION

The invention relates generally to manufacturing verification systems for memory modules, and more particularly to test systems for verifying contact between pins of a memory tester and the I/O pins of a CMOS IC chip or module.

BACKGROUND OF THE INVENTION

Memory test systems typically test memory modules such as CMOS dynamic random access memories (DRAM) for shorted or open data lines and shorted or open address lines and shorted or open control lines. Before such tests may be conducted, however, a contact test is required to ensure that the test system is in contact with the pins of the DRAM, as well as whether the pins are shorted together or open. All known testers test with power applied to the memory I/O pins and a current of the order of 200 $\mu$amps to avoid damaging the memory module under test.

A recognized reference on contact tests is the text "Testing Semiconductor Memories, Theory and Practice", by A. J. van de Goor, John Wiley & Sons, copyrighted 1991, reprinted 1996. In the text, pages 295–297, van de Goor proposes a test circuit where all input and output pins of a memory chip are connected to the Vcc power line and the Vss ground line by way of protection diodes, which are said to ensure that the input and output pins cannot assume a voltage level on one diode voltage drop below Vss or one diode voltage drop above Vcc. A test algorithm for the contact test also is proposed which consists of the following steps:

1. Set all pins to 0 volts.
2. Force a forward biasing current through the diodes in the range of 100 $\mu$amps to 250 $\mu$amps.
3. Measure the voltage Vpin resulting from the forward biasing current, and if |Vpin|<0.1 V, a short is assumed;

if 0.1V≦|Vpin|≦1.5 V, contact is assumed; and if |Vpin|>1.5 V, an open is assumed.

In the above example, the tester cannot distinguish between a short to Vcc or ground, and a short to another pin.

U.S. Pat. No. 5,072,175 to Marek discloses a test method and system for identifying only pin contacts and opens. Pins shorts to a power supply terminal or to ground, and pin to pin shorts are not identified. Further, modification to the component under test is required to add diodes and a test terminal, whether component is a chip or a module.

SUMMARY OF THE INVENTION

An automated contact tester method and system is disclosed and claimed which detects the absence of contacts between I/O pins of the contact tester and I/O pins of a memory module under test, and identifies pins which are shorted to a power supply terminal or ground, pins which are shorted to other pins, and pins which are open.

BRIEF DESCRIPTION OF THE DRAWINGS

The accompanying drawings, which are incorporated in and constitute a part of the specification, illustrate preferred embodiments of the invention, and together with the general description given above and the detailed description of preferred embodiments given below serve to explain the principles of the invention.

DESCRIPTION OF PREFERRED EMBODIMENTS

Figure 1:
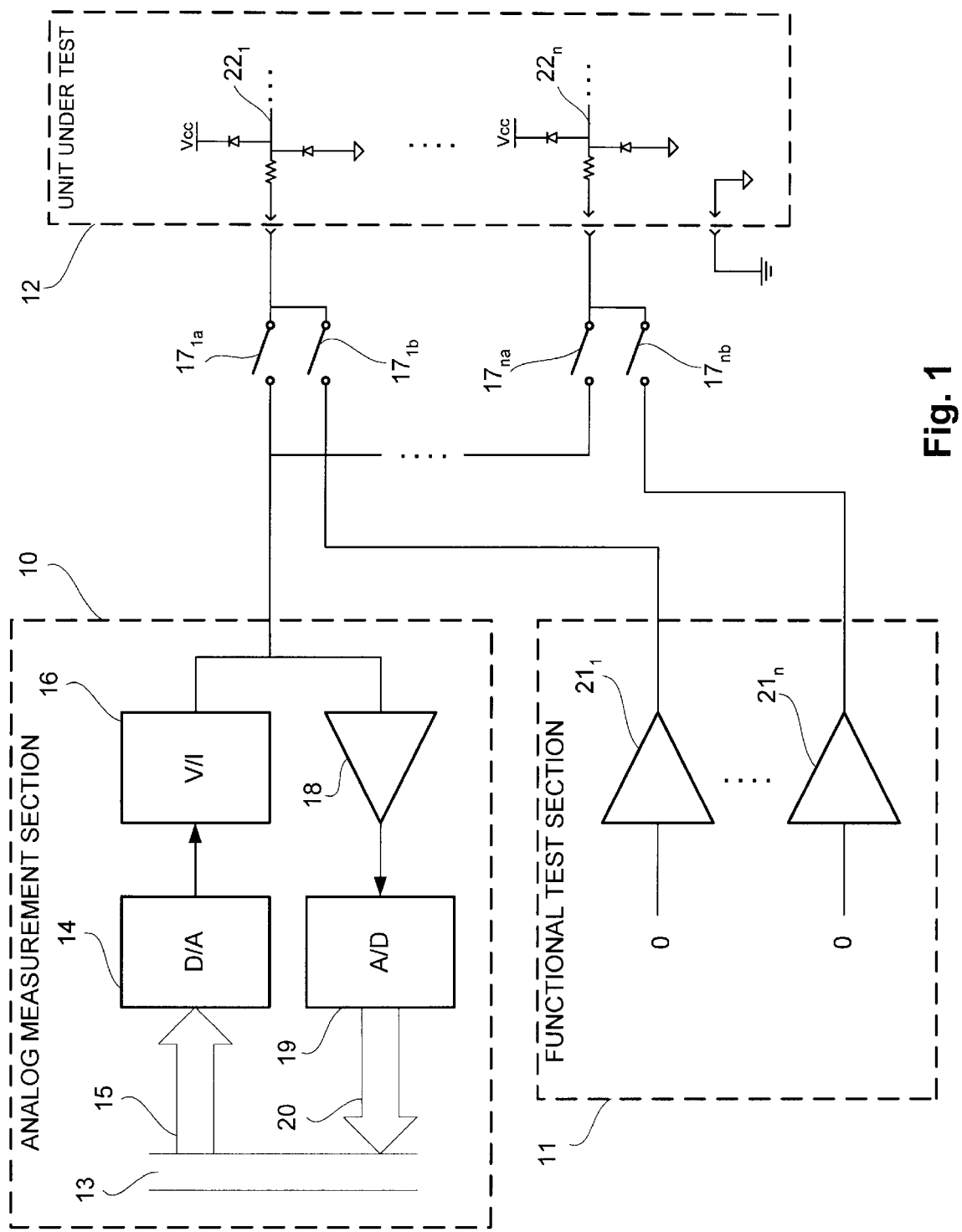
FIG. 1 is an electronic schematic diagram of a contact test circuit.

Referring to FIG. 1, a contact test system is comprised of an analog measurement section 10 and a functional test section 11, which are electrically connected to a memory module 12 through embedded program controlled switches $17_{1a}$–$17_{na}$.

Sections 10 and 11 comprise a parametric measurement unit (PMU). More particularly, a 16-bit backplane bus 13 is in electrical communication with a digital-to-analog converter 14 by way of a 16-bit bus 15. The output of the converter 14 is applied to the input of a modified Howland voltage to current converter 16, the output of which is applied to the input of a single-pole-double-throw switch $17_{1a}$, and to the input of a buffer amplifier 18.

The output of the buffer amplifier 18 is applied to the input of an analog-to-digital converter 19, the output of which is applied to the backplane 13 by way of a 16-bit bus 20.

The input of a second single-pole-single-throw switch $17_{1b}$ is electrically connected to the output of a digital buffer $21_1$, the input of which is held to a logic zero, and the output of which is held to an analog ground.

The pole of switch $17_{1a}$ is electrically connected to the pole of switch $17_{1b}$, and to one of the diode protected I/O pins $22_1$ of the memory module 12.

It is to be understood that there will be as many digital buffers such as buffer $21_1$, and as many pairs of switches such as switches $17_{1a}$ and $17_{1b}$, as there are I/O pins such as $22_1$ for a memory module under test. Thus, by the three dotted lines, and use of the letters 1–n, we indicate that there are n pins $22_1$–$22_n$ as well n pairs of switches ($17_{1a}$, $17_{1b}$–$17_{na}$, $17_{nb}$) and n digital buffers $21_1$–$21_n$.

Continuing with the description of FIG. 1, the input of a digital buffer $21_n$ is held at a logic zero, and the output of the digital buffer $21_n$ is held to an analog ground and applied to the input of switch $17_{nb}$. The pole of switch $17_{nb}$ is electrically connected to the pole of switch $17_{na}$ and to a diode protected pin $22_n$ of the memory module 12. The input to switch $17_{na}$ is electrically connected to the output of converter 16, to the input of amplifier 18, and to the input of the switch $17_{1a}$.

In operation, the $V_{CC}$ source for the memory module 12 is set to 0 volts, and the poles of grounding switches $17_{1b}$–$17_{nb}$ are closed to allow digital buffers $21_1$–$21_n$ to force all pins $22_1$–$22_n$ to ground. Thereafter, a voltage is applied by way of backplane 13 and converters 14 and 16, and grounding switch $17_{1b}$ is opened and measurement switch $17_{1a}$ is closed to cause a forward biasing current to flow through the pin $22_1$. If the voltage sensed at the output of converter 19 is within voltage tolerances, a normal contact between the pin under test and the PMU comprising sections 10 and 11 is presumed. If the voltage is above acceptable tolerance levels, however, an open at the pin $22_1$ is identified.

If the voltage level sensed at the output of converter 19 is lower than acceptable tolerances, the pin $22_1$ is presumed to have a short. However, because all other pins have been connected to ground by the closure of grounding switches $17_{2b}$–$17_{nb}$, it is not determined whether the short detected at pin $22_1$ is to ground or to another externally grounded pin. In this event, all grounding switches $17_{1b}$–$17_{nb}$ would be opened, measurement switch $17_{1a}$ would remain closed, and a second measurement would be conducted at pin $22_1$. Thereafter, if the voltage sensed at the output of converter 19 is lower than acceptable tolerances, the pin $22_1$ is identified as shorted to ground. If, however, the voltage sensed is within acceptable tolerances, then it may be assumed that the previously sensed grounded condition was due to a short to another pin. A search is then conducted to find any pin shorted to pin $22_1$ by sequentially connecting remaining pins $22_2$–$22_n$ to ground using grounding switches $17_2$–$17_n$, respectively, while sensing the voltage measured at pin $22_1$. During this search sequence, when the voltage sensed at pin $22_1$ indicates a grounded condition, it may be identified as shorted to the pin grounded by the grounding switch currently closed.

The above sequence may be repeated for each pin that is determined to be shorted. That is, the measurement switch in electrical communication with the functional test section 11 and associated with the shorted pin remains closed, and the grounding switch of the switch pair is opened while the grounding switches for the remaining pins to be tested are sequentially closed for voltage measurement and then opened, pin after pin, until another shorted pin is discovered.

In the preferred embodiment, the pin voltage measurements are taken and the associated switches are opened and closed under computer program control by a system processor (not shown). FIGS. 2a–2f comprise a logic flow diagram of the logic control process executed by the system processor.

In the description of the logic flow diagrams of FIGS. 2a–2g, the following tables are referenced:

TABLE I

| INDEX | VOLTAGE | EXCLUDED | SHORTED$_{P-P}$ | SHORTED$_{GND}$ |
|---|---|---|---|---|
| 0 | | FALSE | FALSE | FALSE |
| 1 | | FALSE | FALSE | FALSE |
| 2 | | FALSE | FALSE | FALSE |
| . | . | . | . | . |
| . | . | . | . | . |
| . | . | . | . | . |
| MAX_PIN-1 | | FALSE | FALSE | FALSE |

TABLE II

| INDEX | FROM-PIN | TO-PIN |
|---|---|---|
| 0 | | |
| 1 | | |
| 2 | | |
| . | . | . |

TABLE II-continued

| INDEX | FROM-PIN | TO-PIN |
|---|---|---|
| . | . | . |
| . | . | . |
| MAX_PIN-1 | | |

The variables referred to in Tables I and II above are defined in the following Table III:

TABLE III

| NAME | DESCRIPTION |
|---|---|
| LOG_INX | Index into list of shorted pins. When scanning is complete, contains number of shorted pin-to-pin pairs. |
| TEST_INX | Primary loop counter, index into per-pin array, and pin selector. |
| MILLIVOLTS | Holds value read from A/D converter in millivolts. |
| SEARCH_INX | Secondary loop counter, index into per-pin array, and pin selector. |

The constant referred to in the description of the above Tables I and II is described in the following Table IV:

TABLE IV

| NAME | DESCRIPTION |
|---|---|
| MAX_PIN | Equal to the maximum number of pins testable. |

Figure 2A:
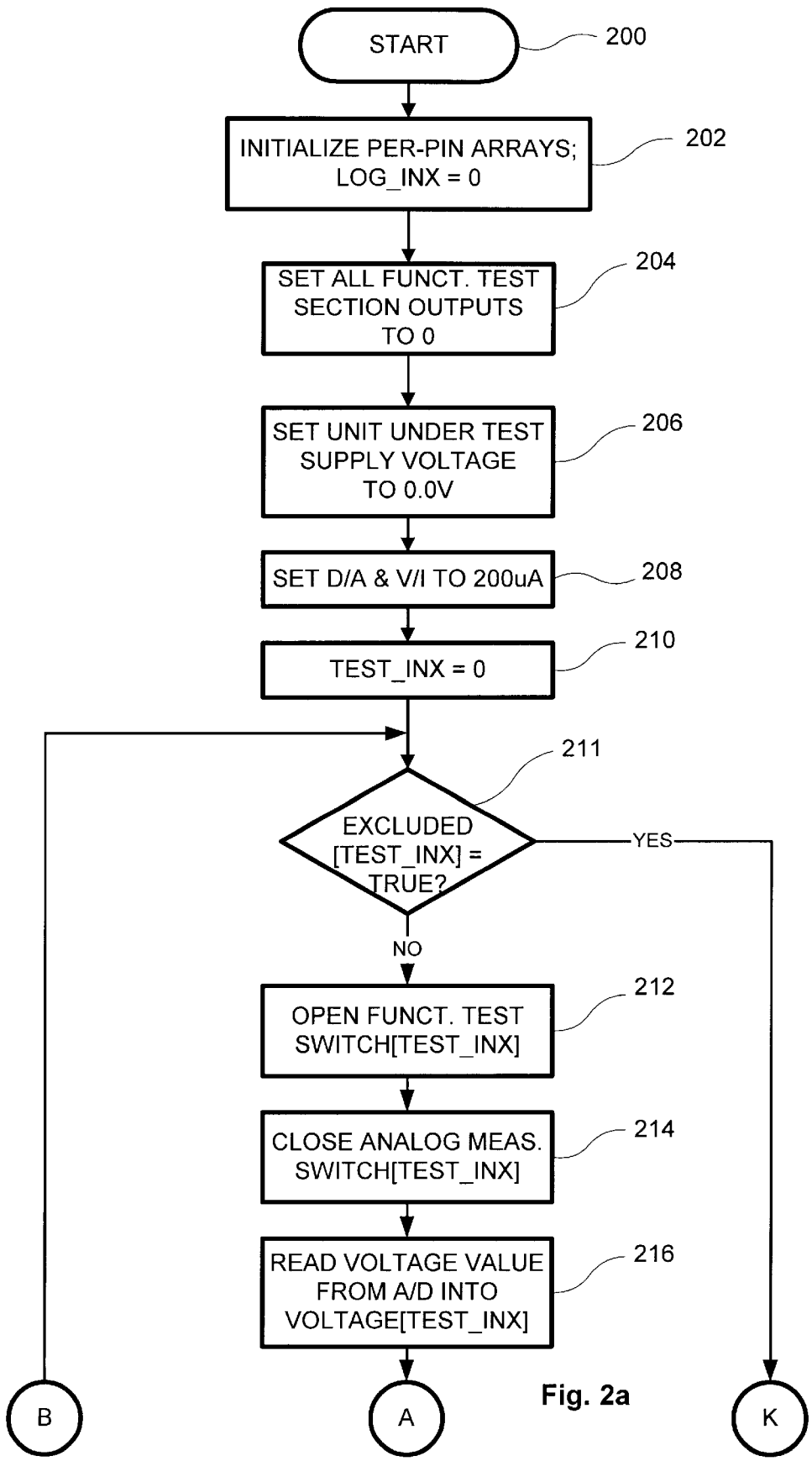
FIGS. 2a–2g together are a logic flow diagram of the steps taken by a programmed computer in conducting a contact test.
Figure 2B:
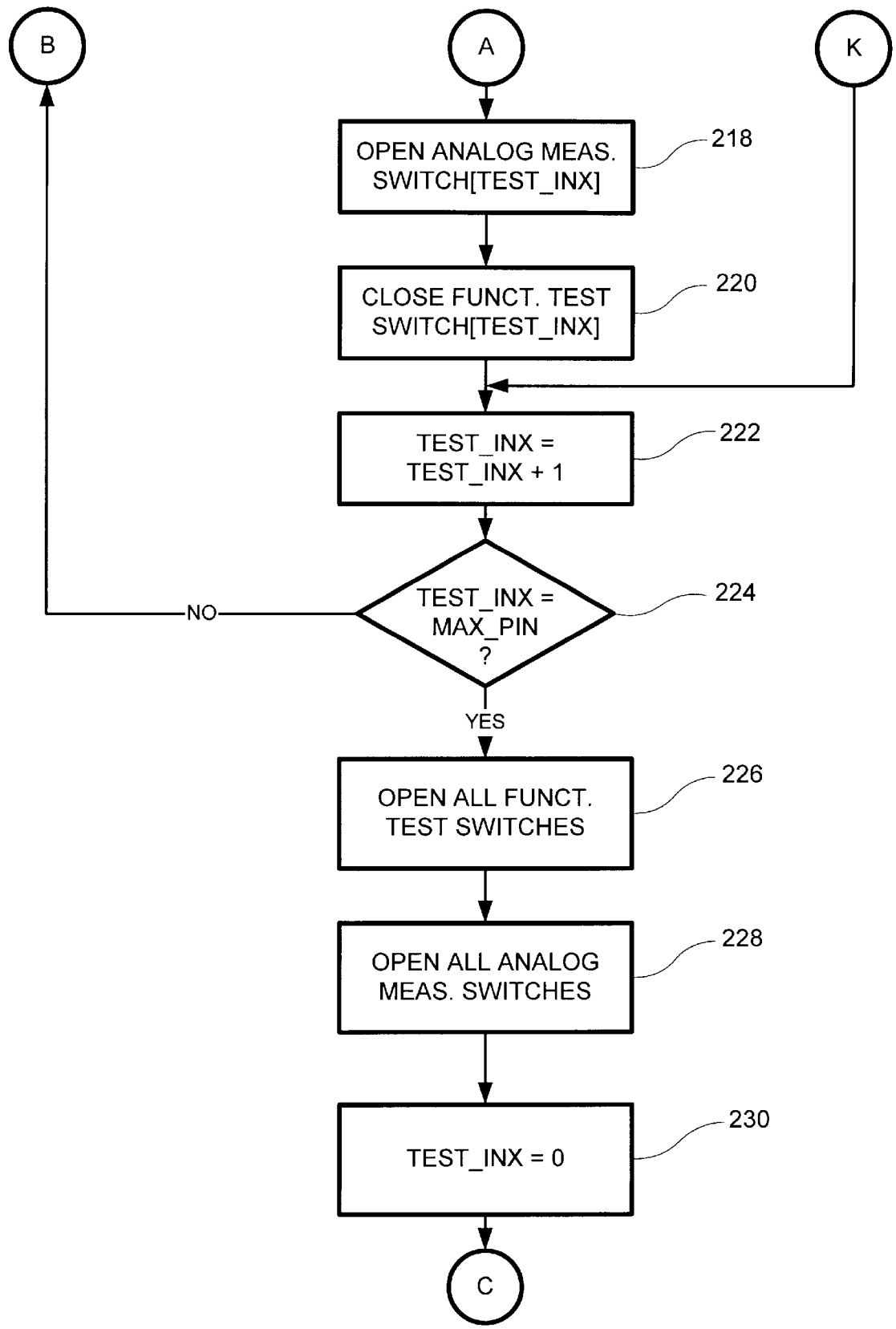
Figure 2C:
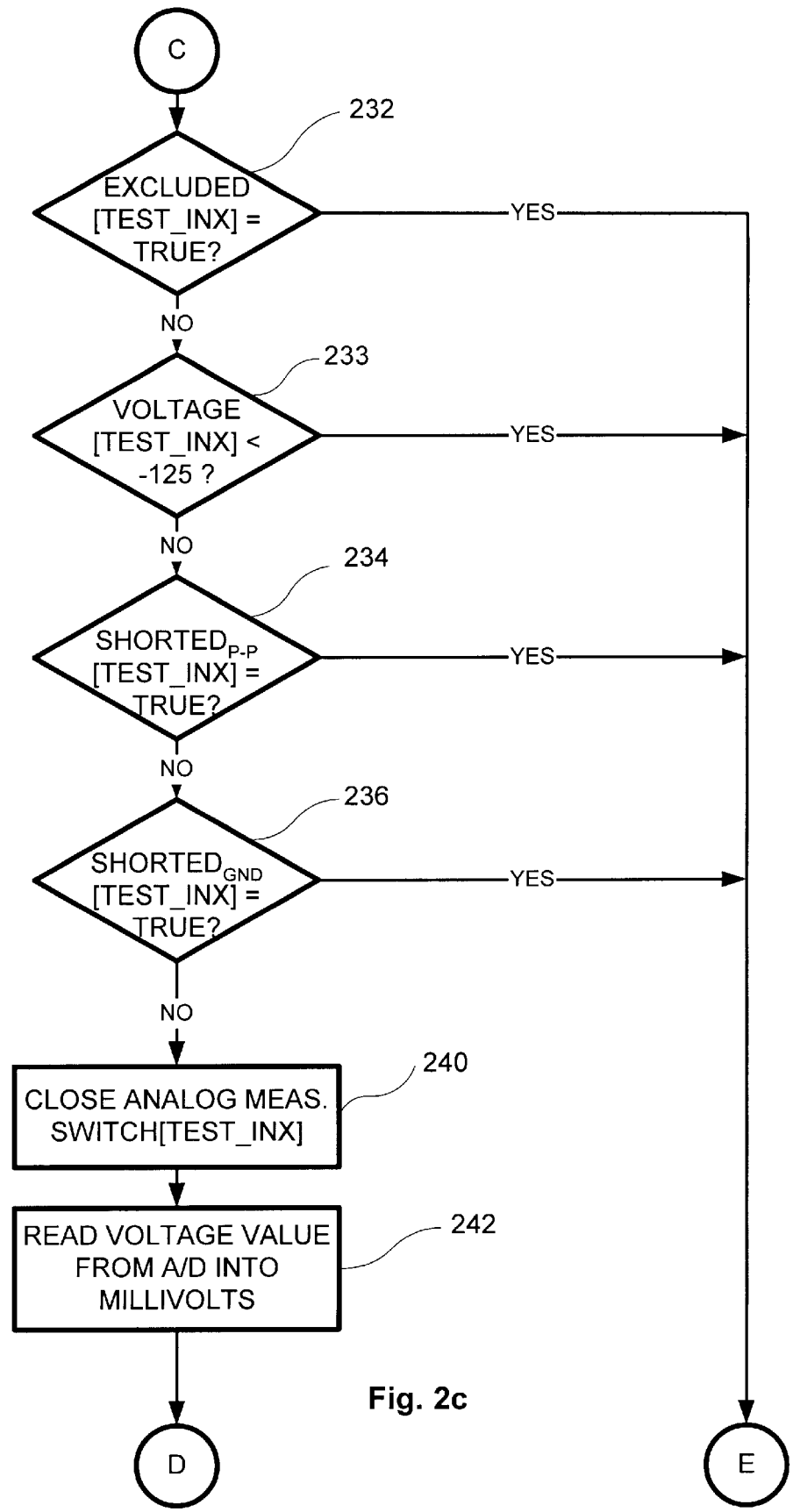
Figure 2D:
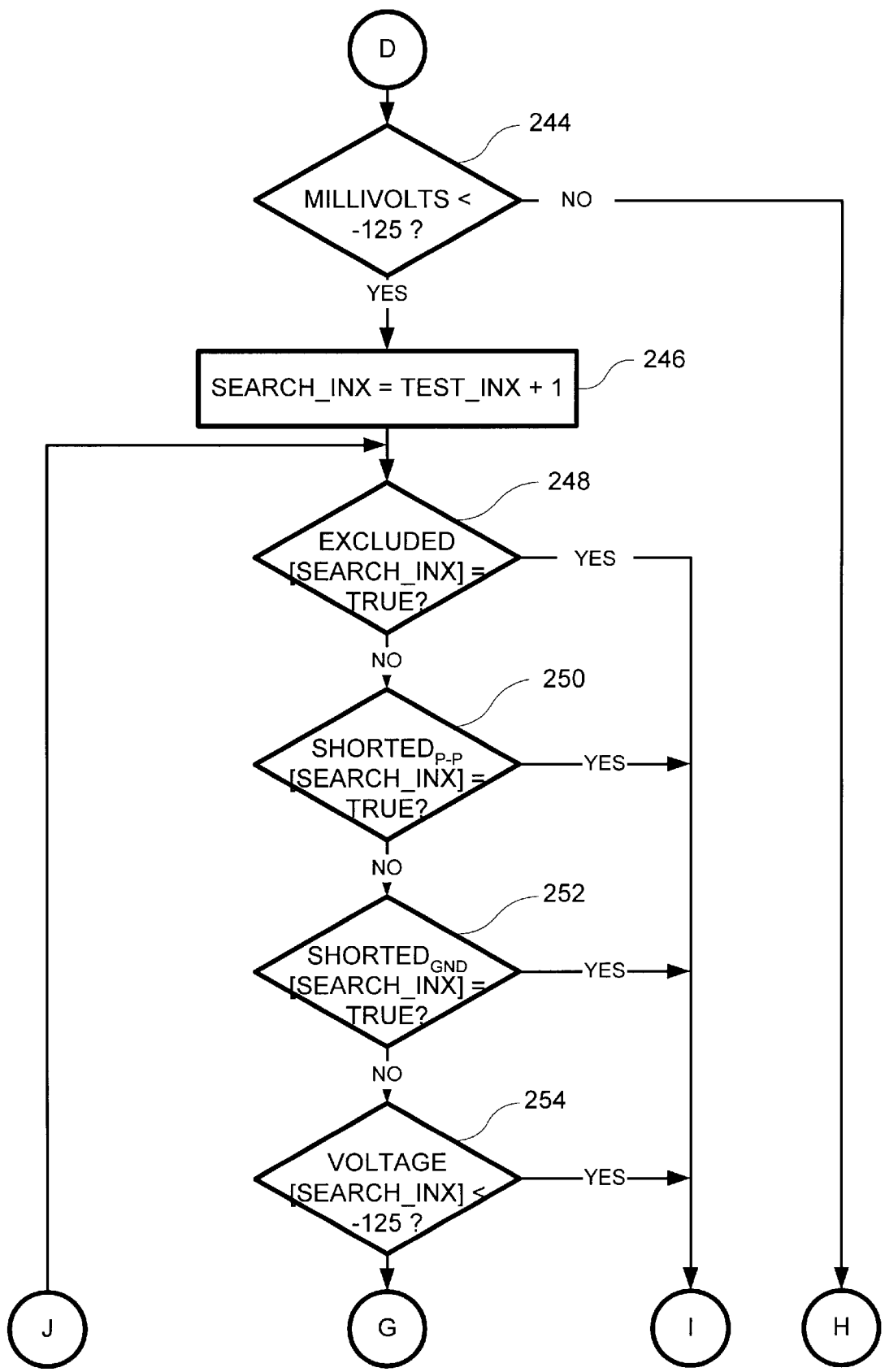
Figure 2E:
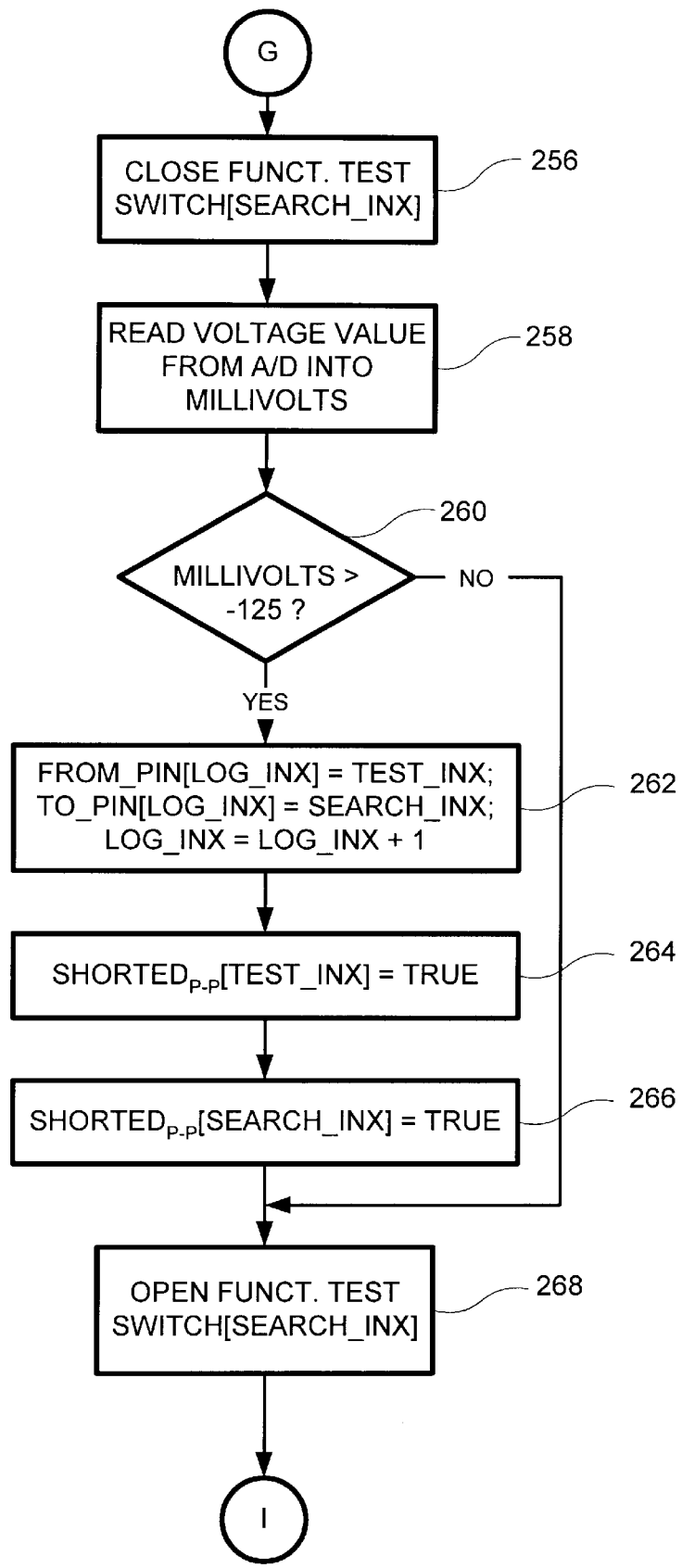

Referring to FIG. 2a, the logic control process begins at logic step 200, and thereafter moves to logic step 202 to initialize Tables I and II associated with the pin arrays of the memory module 12 by clearing all entries except the EXCLUDED entries, which are preset according to the memory module to be tested. Also, the logging index variable Log_INX is reset to "0". The logic control process then proceeds to logic step 204 where the inputs of the digital buffers 21a–21n are set to logic zero. This is in preparation for using the outputs as a ground, and being able to switch a ground onto any one of the test pins.

Following logic step 204, the logic control process continues to logic step 206 where the test supply voltage $V_{CC}$ of the memory module 12 is set to 0.0 volts. The testing of pins now may occur with no voltage applied. The logic control process next proceeds from logic step 206 to logic step 208 where the digital-to-analog converter 14 and the voltage-to-current converter 16 are set to deliver a 200 $\mu$amp output to the pin of memory module 12 which is under test. Thereafter, at logic step 210 the loop counter variable TEST_INX is set to "0" to signify the start of the first loop. From logic step 210 the logic control process continues to logic step 211 where a test is made to see if the pin under test is used by the memory module 12. That is, the memory test system typically has many more pins than the memory module. Thus, fewer than all pins of the memory test system will make contact with corresponding pins of the memory module. If the pin is to be excluded from testing, then the logic control process continues through node K to logic step 222 of FIG. 2b. If, however, the pin under test is to be included in testing, then the logic control process continues to step 212 where the functional test switch $17_{1b}$ is opened for the pin identified by the variable TEST_INX.

Following logic step 212, the logic control process moves to logic step 214 where the analog measurement switch associated with the pin under test is closed. From logic step 214, the logic flow process continues to logic step 216 where the voltage output of converter 19 is read into the VOLTAGE column of Table I as indexed by the variable TEST_INX. The voltage measurement is thereby associated with the pin under test. The logic control process then continues through node A to logic step 218 of FIG. 2b, where the analog measurement switch associated with the pin under test is opened.

The logic flow process next proceeds from logic step 218 to logic step 220 where the functional test switch associated with the pin under test is closed to effectively ground it. Following logic step 220, the logic control process continues to logic step 222 to increment the loop index variable TEST_INX. The logic control process then proceeds to logic step 224, where a test is made to see if the variable TEST_INX has reached the maximum pin count at the end of the test loop as identified by the constant MAX_PIN. If not, the logic control process loops back by way of node B to the beginning of the loop at logic step 211 of FIG. 2a. In the event that the variable has reached the maximum pin count, the logic control process flows to logic step 226 where all functional test switches for all pins are opened. From logic step 226, the logic flow process continues to logic step 228 where all analog measurement switches for all pins are opened to completely float the unit under test with respect to ground.

Following logic step 228, the logic flow process proceeds to logic step 230 where the loop counter index variable TEST_INX is again set to "0" in preparation for reuse. The logic control then proceeds through node C to logic step 232 of FIG. 2c where a test is made to see if the pin under test is used by the memory module 12. At logic step 232 the logic control process accesses the EXCLUDED column of Table I to determine whether the pin indexed by the variable TEST_INX is to be excluded from testing because there is no corresponding memory module pin, or whether the pin under test has a corresponding memory module pin that should be in contact. If a true exists in the EXCLUDED column of Table I in the row of the pin to which the logic control process has been indexed, the pin under test is not to be tested. The logic control process thus branches by way of node E to the end of the test loop at logic step 278 of FIG. 2f, and all testing for the pin under test is stopped. In the event that the pin is to be tested, a false entry will appear in the EXCLUDED column and the row of the pin to which the variable TEST_INX has pointed the logic control process. In that event, the logic control process continues to logic step 233 to determine whether a non-shorted condition exists for the pin under test. At logic step 233, the output of converter 20 in the VOLTAGE column of Table I, and at the row corresponding to the pin under test as indicated by the variable TEST_INX, is accessed to determine whether the converter 20 voltage measurement is more negative than −125 millivolts. If true, then the pin under test is assumed to be non-shorted, and the logic control process branches through node E to logic step 278 of FIG. 2f, where the variable TEST_INX is indexed to point to a new pin of the memory module 12. If false, the pin under test is presumed shorted to ground, and because the supply pin $V_{CC}$ is at 0.0 volts, to be shorted to $V_{CC}$ or to another pin, and the logic control process continues to logic step 234 to determine whether a pin-to-pin short exists for the pin under test by accessing Table I and reviewing the SHORTED$_{P-P}$ column in the INDEX row pointed to by the variable TEST_INX.

Figure 2F:
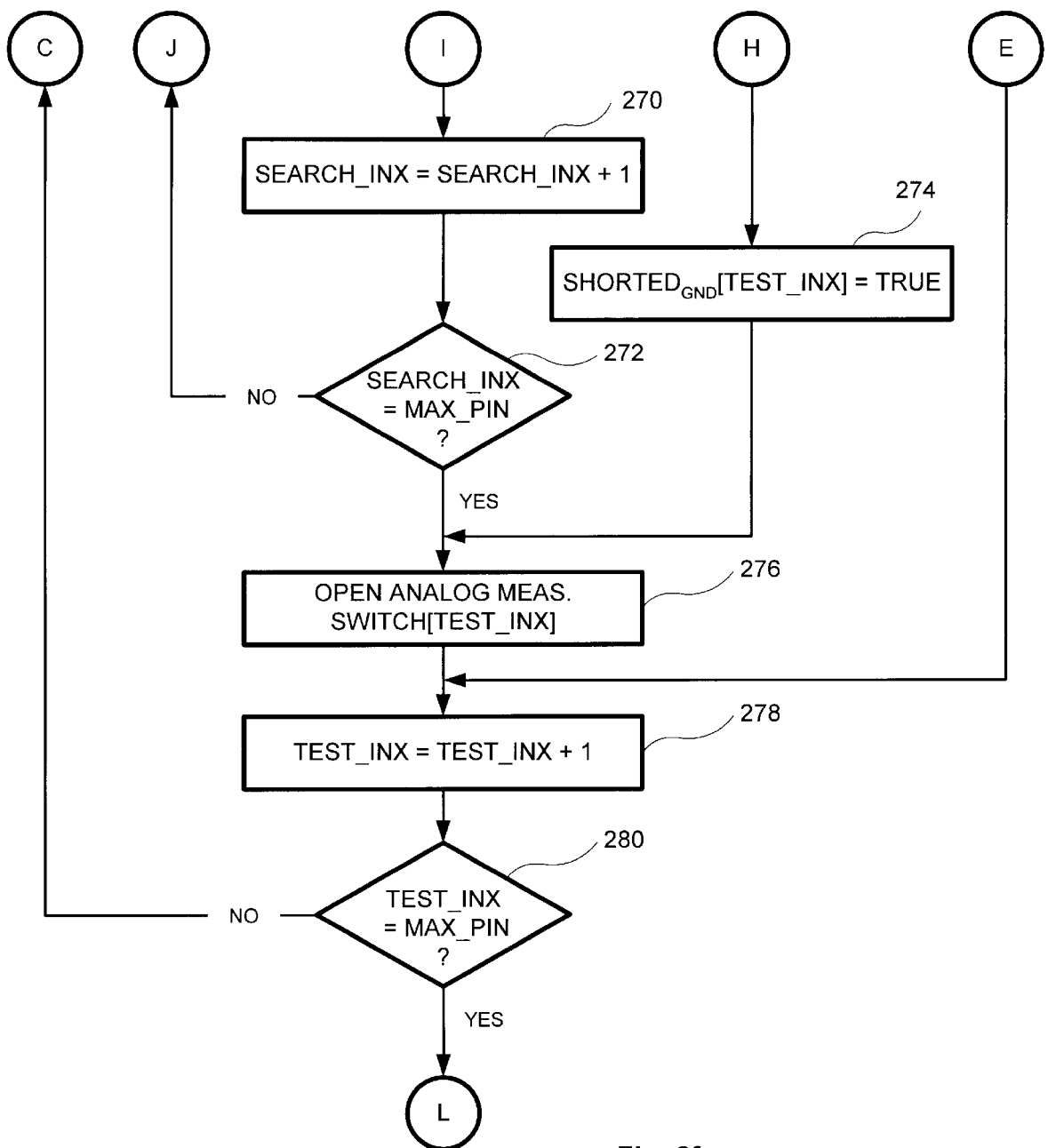
Figure 2G:
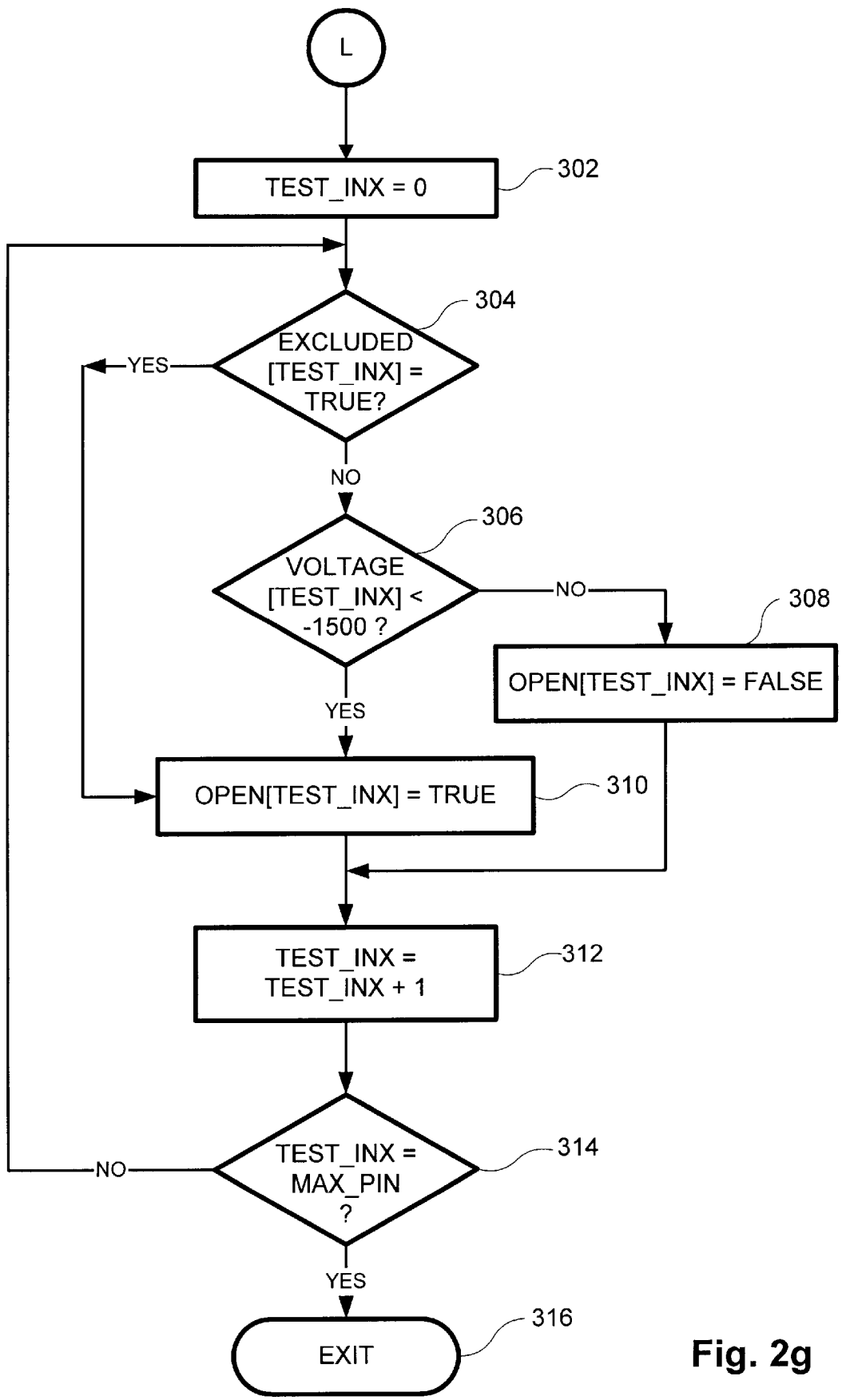

If a true entry is found, the logic control process branches by way of node E to the end of the test loop at logic step 278 of FIG. 2f, and further testing on the pin under test is stopped. If the Table I entry is false, the logic control process continues to logic step 236 where the Table I column SHORTED$_{GND}$ at the row pointed to by the variable TEST_INX is accessed to determine whether a true entry indicating a short to ground exists. If so, the logic control process branches through node E to logic step 278 of FIG. 2f, where the variable TEST_INX is indexed to point to a new pin of the memory module 12. If the Table I entry is false, however, the logic control process proceeds from logic step 236 to logic step 240 where the analog measurement switch for the pin identified in the INDEX column of Table I by the variable TEST_INX is closed.

From logic step 240, the logic control process continues to logic step 242 where the output of the converter 19 is measured and stored in a storage variable MILLIVOLTS. From logic step 242, the logic control process branches by way of node D to logic step 244, where the storage variable MILLIVOLTS is tested to determine whether it has a value less than −125 millivolts. If no, the pin under test is presumed to be shorted to ground because all other pins are floating at the time of the previous measurement. The logic control process thus branches by way of node H to logic step 274 of FIG. 2f. At logic step 274, a TRUE entry is stored in Table I under the column SHORTED$_{GND}$ at the location which is pointed to by the INDEX variable TEST_INX. From logic step 274, the logic control process moves to logic step 276.

If the value stored in the variable MILLIVOLTS is found at logic step 244 to be less than −125 millivolts, the pin under test is not presumed to be shorted to ground, but to some other pin, and the logic control process proceeds to logic step 246 where a new search index SEARCH_INX is initialized to a value equal to the TEST_INX variable incremented by one. This allows an inner test loop to begin scanning pins from the point where the above described outer test loop branched to the end of the array of the memory modules pins. From logic step 246, the logic control process continues to logic step 248 where the column EXCLUDED of Table I is accessed under control of the SEARCH_INX index variable to determine whether the pin under test is to be excluded from further testing. If a TRUE entry is found, the logic control process branches by way of node I to logic step 270 of FIG. 2f.

In the event that the pin under test is to be included in testing, the logic control process moves from logic step 248 to logic step 250 where the column SHORTED$_{P-P}$ of Table I is accessed at the entry specified by the index variable SEARCH_INX. If a TRUE entry is found, the pin under test is presumed to be previously discovered to be shorted to another pin, and the logic control process branches by way of node I to logic step 270. In the event that a FALSE entry is found, the pin is not presumed to be shorted to another pin, and the logic control process continues from logic step 250 to logic step 252 to test for a short to ground. More particularly, the column SHORTED$_{GND}$ of Table I is accessed at the entry pointed to by the index variable SEARCH_INX. If a TRUE entry is found which indicates that the pin under test is shorted to ground, the logic control process branches by way of node I to logic step 270. If a FALSE entry is found, however, the pin is not presumed to be shorted to ground, and the logic control process continues from logic step 252 to logic step 254. At logic step 254, the voltage value in the VOLTAGE column of Table I and at the location pointed to by the index variable SEARCH_INX is tested to determine whether it is less than −125 millivolts. If yes, the pin is not shorted, and the logic control process branches by way of node I to logic step 270 of FIG. 2f. If greater than or equal to −125 millivolts, the logic control process continues from logic step 254 and through node G to logic step 256 of FIG. 2e. At logic step 256, the functional test switch for the pin under test, as identified by the index variable SEARCH_INX for Table I, is closed.

From step 256, the logic control process flows to logic step 258 where the voltage value read measured at the output of converter 19 is written into the temporary storage variable MILLIVOLTS. Thereafter, the logic flow process transfers from logic step 258 to logic step 260 the voltage value stored in the variable MILLIVOLTS is compared with −125 millivolts. If the voltage value stored in variable MILLIVOLTS is less than or equal to −125 millivolts, the logic control process proceeds to logic step 268. However, if the voltage value is greater than −125 millivolts, the logic control process continues from logic step 260 to logic step 262, where the entry in the FROM-PIN column of Table II as indexed by the variable LOG_INX is set equal to TEST_INX. In other words the pin identified by the outer test loop at the time the inner test loop under the index variable SEARCH_INX began is identified in the inner loop. Also, the pin identified by the SEARCH_INX index variable is set in the index variable LOG_INX to identify a particular location under the column TO-PIN of Table II. Lastly, the LOG_INX index variable is indexed by one to point to the next succeeding pin.

Following logic step 262, the logic control process continues to logic step 264 where the location in the SHORTED$_{P-P}$ column of Table I that is identified by the TEST_INX index variable is loaded with a TRUE entry to indicate a pin-to-pin short. Thereafter, the logic control process moves from logic step 264 to logic step 266 where the location in the SHORTED$_{P-P}$ column of Table I that is identified by the SEARCH_INX index variable is set TRUE. This has the effect of marking the FROM-PIN and TO-PIN locations of Table II where the outer test loop ceased to test a pin under test, and where the inner test loop identified a new pin to test. The logic control process next proceeds to logic step 268 where the functional test switch for the pin identified by the index variable SEARCH_INX is opened. The logic control process continues from logic step 268 and through node I to logic step 270 of FIG. 2f.

At logic step 270, the index variable SEARCH_INX is incremented by one. Following logic step 270, the logic control process continues to logic step 272 to determine whether the index variable SEARCH_INX has been incremented to a value equal to the maximum number of memory module pins that can be tested (MAX_PIN). If not, the logic control process loops back through node J to logic step 248 of FIG. 2d at the beginning of the inner test loop. If the index variable SEARCH_INX is determined at logic step 272 to have a value equal to MAX_PIN, however, the logic flow process flows to logic step 276 where the analog measurement switch for the pin identified by the index variable TEST_INX is opened. From logic step 276, the logic control process moves to the end of the outer test loop at logic step 278, where the index variable TEST_INX is incremented by one.

From logic step 278, the logic control process proceeds to logic step 280 where the value stored in the variable TEST_INX is compared with the maximum number of testable pins stored in MAX_PIN. If the MAX_PIN value has not been reached, the logic control process branches back by way of node C to logic step 232 of FIG. 2c at the beginning of the outer test loop. In the event that the variable TEST_INX has reached the maximum constant stored in MAX_PIN, the logic control process proceeds by way of node L to logic step 302 of FIG. 2g.

ALTERNATIVE EMBODIMENT

In the description of the logic flow diagram of FIG. 3, the following table is referenced:

TABLE V

| INDEX | OPEN |
|---|---|
| 0 | FALSE |
| 1 | FALSE |
| 2 | FALSE |
| . | . |
| . | . |
| . | . |
| MAX_PIN-1 | FALSE |

At logic step 302, the logic control process initializes loop counter variable TEST_INX to "0" to signify the start of the first loop. From logic step 302, the logic control process continues at logic step 304 where a test is made to see if the pin under test was used by the memory module 12. If the pin was excluded from testing, then the logic control process continues to logic step 310 where the pin under test may also be flagged as "open", that is, not electrically connected to the tester. If, however, the pin was included in testing, then the logic control process continues to logic step 306 to determine whether an open pin condition exists for the pin under test. At logic step 306, the output of converter 20 in the VOLTAGE column of Table I, and at the row corresponding to the pin under test as indicated by the variable TEST_INX, is accessed to determine whether the converter 20 voltage measurement is more negative than −1500 millivolts. If false, then the pin under test is assumed to be either correctly connected or shorted, and the logic control process branches to logic step 308 where the location in the OPEN column of Table V that is identified by the TEST_INX index variable is loaded with a FALSE entry to indicate a non-open pin. If true, the logic control process continues to logic step 310 where the location in the OPEN column of Table V that is identified by the TEST_INX index variable is loaded with a TRUE entry to indicate an open pin. From either of logic steps 308 or 310, the logic control process continues at logic step 312 to increment the loop counter variable TEST_INX. From logic step 312, the logic control process continues to logic step 314 where the value stored in the variable TEST_INX is compared with the maximum number of testable pins stored in MAX_PIN. If the MAX_PIN value has not been reached, the logic control process branches back to logic step 304 at the beginning of the loop. In the event that the variable TEST_INX has reached the maximum constant stored in MAX_PIN, the logic control process exits the outer test loop at logic step 316 with "TRUE" entries in the OPEN column of Table V reflecting open pins of the memory module 12.

The invention has been described and shown with reference to particular embodiments, but variations within the spirit and scope of the general inventive concept will be apparent to those skilled in the art. Accordingly, it should be clearly understood that the form of the invention as described and depicted in the specification and drawings is illustrative only, and is not intended to limit the scope of the invention. All changes which come within the meaning and range of the equivalence of the claims are therefore intended to be embraced therein.

What is claimed is:

1. A system for testing for absence of electrical contacts between I/O pins of a memory tester and I/O pins of a memory module under test, and for memory module I/O pins which are shorted to ground, shorted to other memory module I/O pins, or open, which comprises:

analog measurement means for generating a forward biasing current to a memory module I/O pin under test, measuring a resulting analog voltage across said memory module I/O pin under test, and converting said resulting analog voltage to a first digital voltage;

a system processor in electrical communication with said analog measurement means for providing switch commands, supplying a second digital voltage to said analog measurement means for generation of said forward biasing current, and measuring said first digital voltage and comparing said first digital voltage to threshold values to detect said electrical contacts, pin shorts to ground, pin-to-pin shorts, and pin opens;

functional test means for applying an analog ground to said memory module I/O pin under test; and programmable switch pair means in electrical communication with said analog measurement means, said functional test means, said I/O pins of a memory module under test, and said system processor; and responsive to said switch commands for selectively and electrically connecting said functional test means to said I/O pin under test to bring said I/O pin under test to analog ground, and for selectively and electrically connecting said analog measurement means to said I/O pin under test to apply said forwarding biasing current to said I/O pin under test and accommodate measurement of said resulting voltage.

2. The system of claim 1, wherein said analog measurement means is comprised of; a backplane bus, a digital-to-analog converter electrically connected to said backplane bus, said digital-to-analog converter having an output, a voltage-to-current converter having an input and an output, said input of said voltage-to-current converter electrically connected to said output of said digital-to-analog converter, a buffer amplifier having an input and an output, said input of said buffer amplifier electrically connected to said output of said voltage-to-current converter, and an analog-to-digital converter having an input and an output, said input of said analog-to-digital converter electrically connected to said output of said buffer amplifier and said output of said analog-to-digital converter electrically connected to said backplane bus.

3. The system of claim 1, wherein said functional test means is comprised of a n digital buffers with an input electrically connected to a digital logic zero, and an output at analog ground, where n is equal to the number of said I/O pins of a memory module under test.

4. The system of claim 1, wherein said programmable switch means is comprised of single pole, single throw switch pairs in which each single pole, single throw switch is independently controlled by said system processor.

5. A system for classifying a short associated with a pin of an electrical circuit having a plurality of pins, which comprises:

a grounding device operable to couple to a plurality of pins;

a measuring device operable to couple to a pin and to measure a voltage in the pin, the measuring device further operable to induce the voltage by generating a current and applying the current to the pin;

a switching device operable to couple the measuring device to the pin, the switching device further operable to individually and selectively couple the grounding device to the plurality of pins; and a system processor communicatively coupled to the measuring device and the switching device, the system processor operable to direct the measuring device and the switching device, the system processor further operable to identify and classify a short associated with the pin by comparing a measurement of the voltage against a threshold voltage.

6. The system of claim 5, wherein the system processor is further operable to identify open circuits by comparing the measurement of the voltage against a second threshold voltage.

7. The system of claim 5, wherein the measuring device comprises:

a backplane bus;

a digital-to-analog converter electrically connected to the backplane bus, the digital-to-analog converter having an output;

a voltage-to-current converter having an input and an output, the input of the voltage-to-current converter electrically connected to the output of the digital-to-analog converter;

a buffer amplifier having an input and an output, the input of the buffer amplifier electrically connected to the output of the voltage-to-current converter; and an analog-to-digital converter having an input and an output, the input of the analog-to-digital converter electrically connected to the output of the buffer amplifier, the output of the analog-to-digital converter electrically connected to the backplane bus.

8. A method of detecting absence of electrical contacts between first I/O pins of a memory module and second I/O pins of a memory tester, and any of said first I/O pins which have a short to a power supply terminal or to ground, a short to other of said first I/O pins, or are open, which comprises the steps of:

identifying those of said second I/O pins which will be excluded from testing and a maximum number n of said first I/O pins which will be tested;

setting a test supply voltage $V_{CC}$ of said memory module to 0.0 volts;

applying an analog ground to all of said first I/O pins;

removing said analog ground from a one of said first I/O pins that is under test;

generating and applying a forward biasing current to said one of said first I/O pins under test;

measuring a first voltage across said one of said first I/O pins under test;

applying an analog ground to said one of said first I/O pins under test;

recording said first voltage for said one of said first I/O pins under test;

repeating each of the above steps for each of remaining n−1 ones of said first I/O pins under test;

comparing said first voltage for each of said n of said first I/O pins under test with threshold voltage to determine whether any of said first I/O pins under test is shorted;

remove said analog ground from all of said first I/O pins;

generating and applying said forward biasing current to said one of said I/O pins under test;

measuring a second voltage in sequence across each of said n of said first I/O pins under test;

as said second voltage is measured from pin to pin in sequence, comparing said second voltage for each of said n of said first I/O pins under test with said threshold voltages to determine whether said each of said n of said first I/O pins under test is shorted;

for first ones of said n of said first I/O pins under test which are found to be shorted, recording a short to ground;

for second ones of said n of said first I/O pins under test which are found to be other than shorted, applying said analog ground to all remaining ones of said n of said first I/O pins under test in sequence;

for each application of said analog ground to said all remaining ones, generating and applying said forward biasing current to a one of said second ones under test and measuring a third voltage across said one of said second ones;

comparing said third voltage with threshold voltages to determine whether said one of said second ones is shorted;

if a short is detected, recording said one of said second ones under test and a one of said all remaining ones to which said analog ground is being applied as a pin-to-pin shorted pair; and repeating four steps immediately above for all remaining ones of said second ones.

9. The method of claim 8, including the steps of:

identifying those of said second I/O pins which will be excluded from testing and a maximum number n of said first I/O pins which will be tested;

comparing said first voltage for each of said n of said first I/O pins under test with threshold voltage to determine whether any of said first I/O pins under test is open;

if an open is detected for said any of said first I/O pins under test, recording said any of said first I/O pins under test; and repeating three steps immediately above for all remaining ones of said first I/O pins under test.

10. A method for classifying a short in an electrical circuit having a plurality of pins, comprising the steps of:

(a) identifying a short associated with a pin of the electrical circuit;

(b) if an applied ground is coupled to any of the plurality of pins, uncoupling the applied ground from all of the plurality of pins;

(c) applying a current to the pin; and (d) measuring a voltage in the pin induced by the current to determine whether the short associated with the pin is a short to ground or a pin-to-pin short to another of the plurality of pins.

11. The method of claim 10, wherein determining whether the short associated with the pin is a short to ground or a short to another of the plurality of pins comprises the step of:

comparing the voltage against a threshold voltage.

12. The method of claim 10, comprising the additional step of:

if the short is a pin-to-pin short to another of the plurality of pins, identifying the other of the plurality of pins.

13. The method of claim 10, wherein the electrical circuit comprises a memory module, further wherein the plurality of pins are I/O pins.

14. The method of claim 10, further comprising the steps of:

identifying a second short associated with a second pin; and repeating steps (b), (c), and (d) with the second pin.

15. The method of claim 10, wherein the step of identifying a short associated with a pin of the electrical circuit comprises the steps of:

(a) identifying a pin to test from the plurality of pins;

(b) coupling an applied ground to the plurality of pins such that the identified pin is not coupled to the applied ground;

(c) applying a current to the identified pin;

(d) measuring a voltage in the identified pin induced by the current; and (e) comparing the voltage against a threshold voltage to determine if the identified pin is shorted.

16. The method of claim 15, further comprising the step of:

comparing the voltage against a second threshold voltage to determine if the identified pin is open.

17. The method of claim 15, further comprising the steps of:

identifying a second pin to test from the plurality of pins; and repeating steps (b), (c), (d), and (e) with the second identified pin.

18. The method of claim 12, wherein searching to identify the other of the plurality of pins to which the pin is pin-to-pin shorted comprises the steps of:

selecting a first of the plurality of pins which is not the pin;

removably coupling the applied ground to the first of the plurality of pins;

applying a current to the pin;

measuring a voltage in the pin induced by the current;

comparing the voltage against the threshold voltage to determine if the pin is shorted; and if shorted, identifying the pin and the first of the plurality of pins as a shorted pin-to-pin pair.

19. The method of claim 18 further comprising the steps of:

removing the applied ground from the first of the plurality of other pins;

removably coupling the applied ground to a second of the plurality of pins;

applying a current to the pin;

measuring a voltage in the pin induced by the current;

comparing the voltage against the threshold voltage to determine if the pin is shorted; and if shorted, identifying the pin and the second of the plurality of pins as a shorted pin-to-pin pair.

20. The method of claim 16, wherein the threshold voltage is smaller than the second threshold voltage.

* * * * *